(12) United States Patent
Schoormans et al.

(10) Patent No.: US 7,102,736 B2
(45) Date of Patent: Sep. 5, 2006

(54) METHOD OF CALIBRATION, CALIBRATION SUBSTRATE, AND METHOD OF DEVICE MANUFACTURE

(75) Inventors: Carolus Johannes Catharina Schoormans, Hoge Mierde (NL); Johannes Mathias Theodorus Antonius Adriaens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 154 days.

(21) Appl. No.: 10/878,626

(22) Filed: Jun. 29, 2004

(65) Prior Publication Data

US 2005/0286042 A1    Dec. 29, 2005

(51) Int. Cl.
*G03B 27/32* (2006.01)
*G03B 27/42* (2006.01)
*G03C 5/00* (2006.01)

(52) U.S. Cl. ............................. 355/77; 355/53; 430/30
(58) Field of Classification Search .................. 355/40, 355/53, 72, 75, 77; 430/5, 22, 30; 356/450, 356/496, 498, 500, 614
See application file for complete search history.

(56) References Cited

U.S. PATENT DOCUMENTS

| | | | | |
|---|---|---|---|---|
| 5,363,196 A | * | 11/1994 | Cameron | 356/500 |
| 6,057,921 A | * | 5/2000 | Yao | 356/500 |
| 7,019,843 B1 | * | 3/2006 | Hill | 356/500 |
| 2003/0035114 A1 | * | 2/2003 | Hill | 356/500 |
| 2005/0134862 A1 | * | 6/2005 | Hill | 356/500 |

* cited by examiner

*Primary Examiner*—Rodney Fuller
(74) *Attorney, Agent, or Firm*—Pillsbury Winthrop Shaw Pittman LLP

(57) ABSTRACT

A method of calibration according to one embodiment includes moving a table to a plurality of exposure positions. At each position, a first part of a measurement system measures a position of the table along each of two orthogonal axes in the plane, and a mark is exposed onto the substrate. For each mark, and for two different orientations of the substrate, a second part of the measurement system measures measurement positions of the table corresponding to the mark. Based on the measured positions, a characterization of a position measurement error of the measurement system along one of the orthogonal axes, as a function of position along both of the orthogonal axes, is obtained.

36 Claims, 17 Drawing Sheets

METHOD OF CALIBRATION, CALIBRATION SUBSTRATE, AND METHOD OF DEVICE MANUFACTURE

FIELD OF THE INVENTION

The present invention relates to precision positioning (in lithographic applications, for example).

BACKGROUND

A lithographic apparatus is a machine that may be used to apply a desired pattern onto a target portion of a substrate. Lithographic apparatus are used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning" direction) while synchronously scanning the substrate parallel or anti-parallel to this direction.

The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface.

In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures may be used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer.

If several layers are required, then it may be necessary to repeat the whole procedure, or a variant or portion thereof, for each new layer, with the overlay (juxtaposition) of the various stacked layers being performed as accurately as possible. For such purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position (for example, with respect to the projection system). Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

Interferometric systems (e.g. systems including one or more laser interferometers) are conventionally used to accurately position the substrate table (or "chuck") so as to present different target portions of the substrate in the path of the beam. The system may be arranged such that a laser beam is reflected off of a mirrored side surface of the substrate table. The table will typically include at least one such mirror for measurement in each of the x and y directions. In practice, these mirrors albeit finished to be flat have some unflatness. The unflatness of the mirrors of the substrate table can lead to errors in positioning which may ultimately lead to, for example, errors in overlay of individual layers of a device.

Substrate table position measurement error can arise, not only from the unflatness of the mirrors as discussed above, but also from a non-orthogonality between x-y mirrors as well as (typically to a lesser degree) a difference in scale between measurements along the various coordinate axes. The measured position of the table may thus include a deviation from the actual position of the table. Consequently, calibration may be required to support compensation for the effects of nonidealities in the measurement system.

SUMMARY

A method of calibration according to an embodiment of the invention includes moving a table to a plurality of exposure positions in a plane substantially parallel to a principal surface of a substrate carried on the table and, at each of the plurality of exposure positions, using a first part of a measurement system to measure a first position of the table along each of two orthogonal axes in the plane and exposing a mark onto the substrate. The method also includes, for each of said marks, using a second part of the measurement system different than the first part to measure along at least one of the two orthogonal axes a measurement position of the table corresponding to the mark, and recording said measured exposure and measurement positions. Based on said recorded positions, a position measurement error of the measurement system is determined.

Embodiments of the invention also include calibration substrates, device manufacturing methods including one or more methods of calibration as described herein, and computer program products including machine-readable instructions describing one or more such methods of manufacture and/or calibration.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
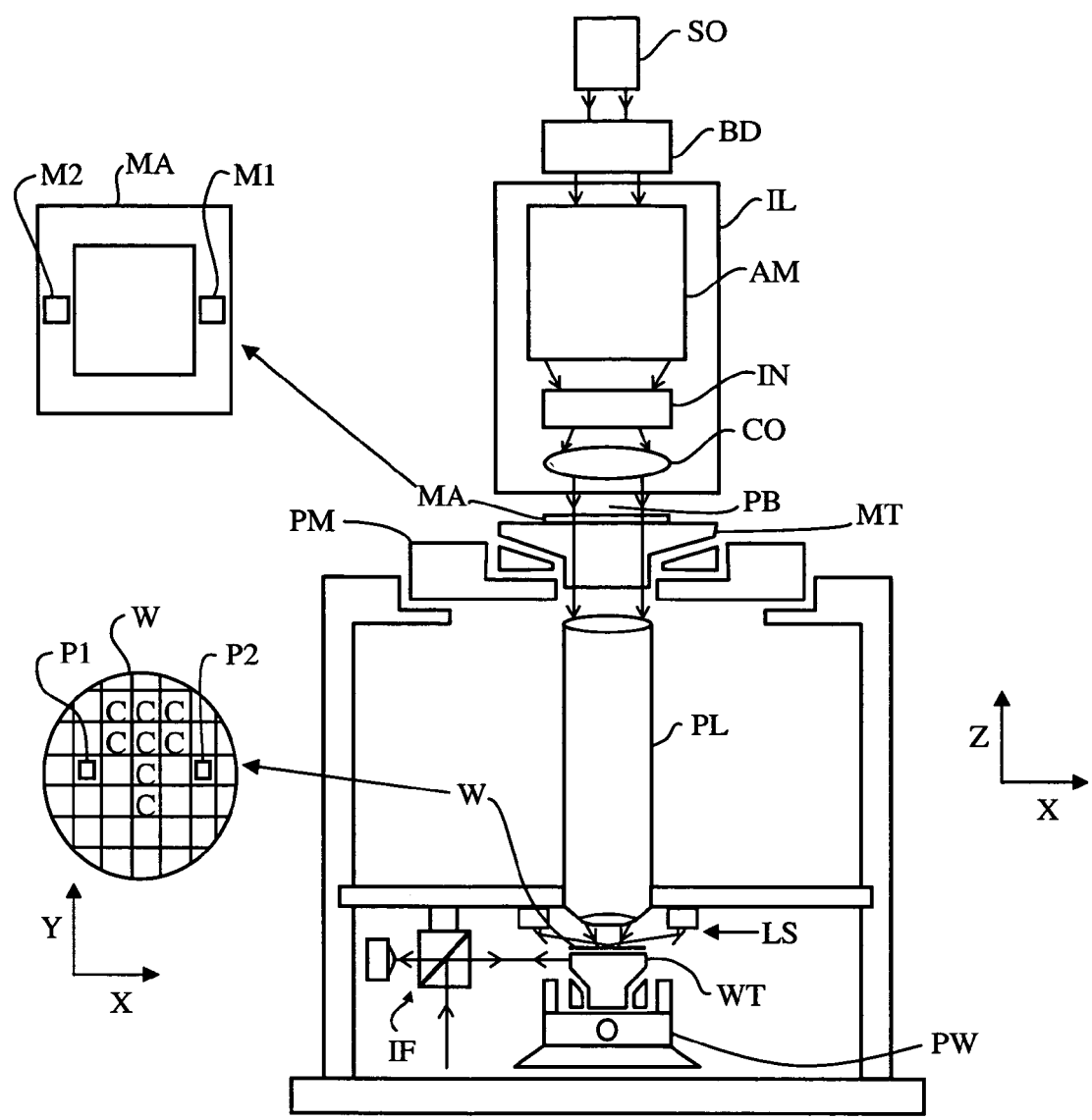
FIG. 1 depicts a lithographic apparatus that may be used in an embodiment of the invention.

FIG. 1 schematically depicts a lithographic apparatus according to a particular embodiment of the invention. The apparatus includes an illumination system (illuminator) IL adapted to condition a beam PB of radiation (e.g. UV radiation), a support structure (e.g. a mask table) MT configured to hold a patterning device (e.g. a mask) MA and connected to first positioning device PM configured to accurately position the patterning device with respect to item PL, a substrate table (e.g. a wafer table) WT configured to hold a substrate (e.g. a resist-coated wafer) W and connected to second positioning device PW configured to accurately position the substrate with respect to item PL; and a projection system (e.g. a refractive projection lens) PL adapted to image a pattern imparted to the beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the apparatus, for example when the source is a mercury lamp. The source SO and the illuminator IL (together with the beam delivery system BD, if required) may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the one or both of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above. Combinations and/or variations on the above described modes of use or entirely different modes of use may also be employed.

In applications of precise positioning technology, a platform or table carries an object that is to be precisely positioned with respect to some reference. In one such application, a substrate table (also called wafer stage or wafer chuck) is used to precisely position a substrate with respect to a reference such as a projection lens system. Sensors may be used to detect a position of the table in several coordinates. For example, a substrate table is conventionally provided with mirrors Mx and My disposed on adjacent side of a wafer chuck WT such that alignment beams from laser interferometers can be reflected off of the mirrors to allow measuring the relative position of the chuck or wafer stage WS (see, e.g., FIG. 2). In other implementations, the position of a table in several coordinates may be measured using other optical sensing configurations (e.g. optical encoders, possibly interferometric) or other sensing technologies (e.g. capacitive sensors) or a combination of such sensors. In some implementations, measurement along a Z axis (orthogonal to X and Y) and/or measurement with respect to an axis of rotation may be desired.

Figure 2:
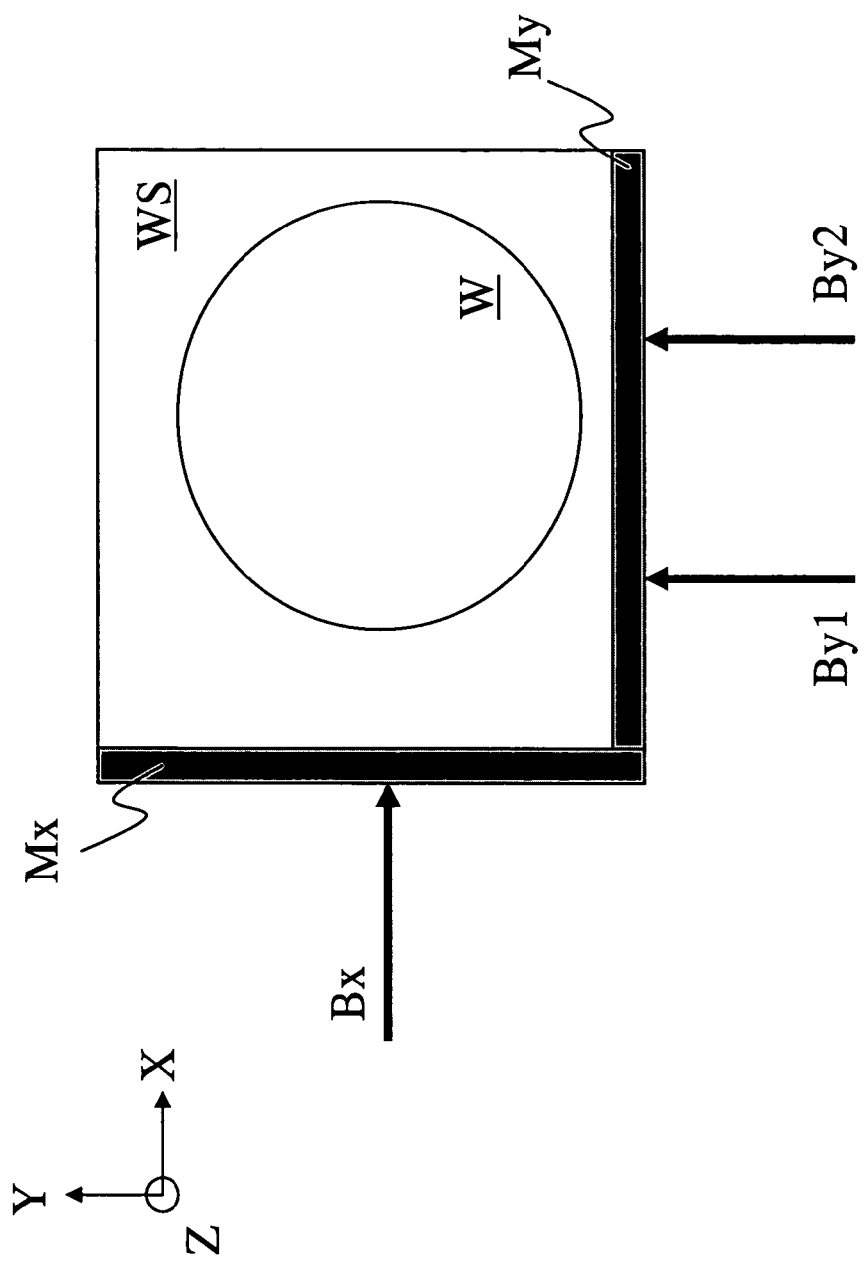
FIG. 2 depicts schematically a position measuring system that may be used in an embodiment of the invention.

FIG. 2 depicts schematically a typical position measuring system. This particular example shows the system being applied to measure a position of a wafer chuck WS holding a wafer W. The wafer chuck is provided with mirrors Mx and My disposed on adjacent sides of chuck WS such that the laser beams Bx, By1 and By2 can be reflected to interferometrically determine the position of the chuck along each of the X and Y axes. The chuck WS is movable to various positions in (at least) the X-Y plane within a certain range of motion along the X and Y axes (e.g. such that beams Bx, By1, and By2 remain incident on mirrors Mx and My). In this example, two beams By1 and By2 are provided to allow measurement of rotation around the z axis. The system may be configured to measure position in the y direction by using beam By1, or by using beam By2, or by taking the average of measurements using both beams. Rotation around the z axis may be measured by taking a difference between the measurements by beams By1 and By2 and dividing that difference by the distance between the beams By1 and By2.

In order to determine position in X, Y, and Rz, at least three beams are needed. In other arrangements, two beams may be used in the X direction rather than the Y direction, or two or more beams may be used for each direction (e.g. for redundancy). Beams may also be provided to support measurement of rotation about the X and/or Y axes. Systems are also possible that include one or more other measurement sensors (e.g. optical encoders, capacitive sensors), whether alternatively or additionally to a beam/mirror arrangement as shown.

Figure 3:
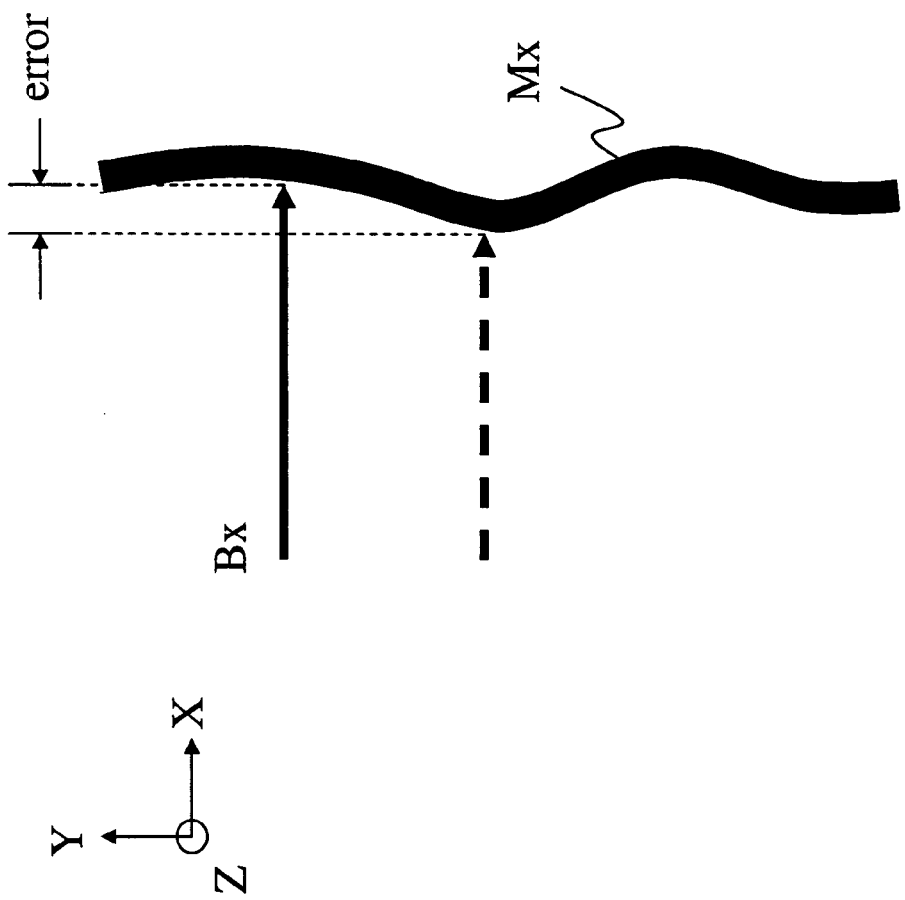
FIG. 3 shows an example of mirror unflatness.
Figure 4:
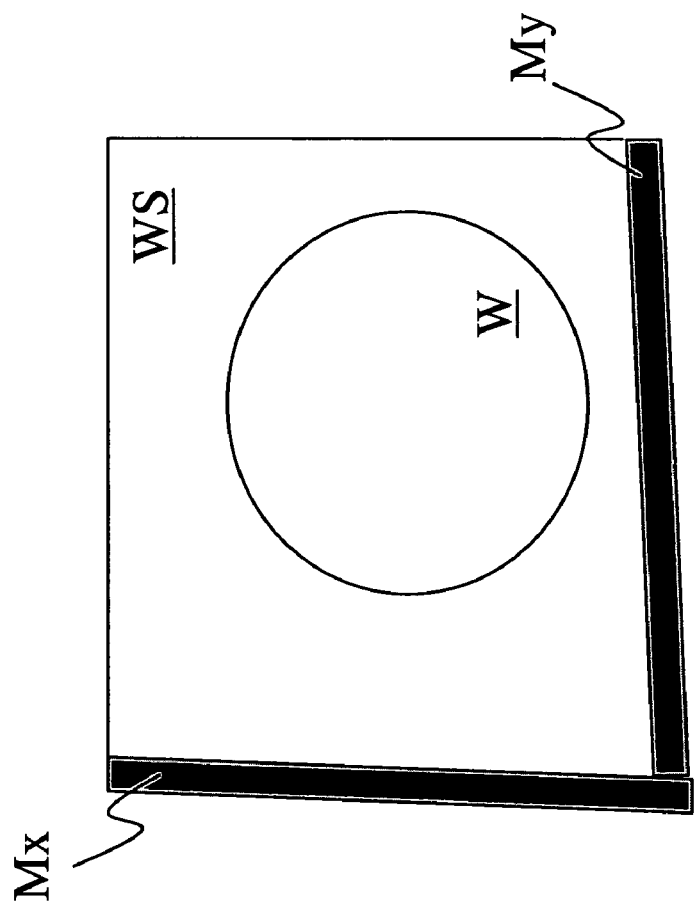
FIG. 4 shows a grossly overexaggerated example of nonorthogonality.

Factors such as nonidealities in the sensing system may contribute to a displacement between a measured position of the table and the actual position of the table when that measurement was made. In a Cartesian coordinate system based on orthogonal axes having the same scale, this error may be represented as a displacement between the measured position $(x_m, y_m)$ and the actual position $(x_a, y_a)$. In an interferometric measurement system that uses mirrors Mx and My as described above, such a measurement error can arise from unflatness of the mirrors (e.g. as shown in FIG. 3), non-orthogonality between mirrors used for measurements along different coordinate axes (e.g. as shown in FIG. 4), and (although typically to a lesser degree) a scaling error between measurements along different coordinate axes. A scaling error may arise, for example, from the use of different sensors (e.g. different lasers, possibly having different wavelengths) to measure positions along the X and Y directions, respectively. One may also recognize that other sensing modalities (e.g. capacitive sensors arranged to measure a distance to a side surface of a table) may also suffer from nonorthogonality and/or surface unflatness errors, such that principles of the invention as described herein may be applied to such situations as well.

The effects of some errors (e.g. mirror unflatness and non-orthogonality) may vary from one measured position to another. For example, FIG. 3 shows that the mirror unflatness error in x is a function of position in y. Therefore, it may be useful to represent the position-dependent deviation between a measured position $(x_m, y_m)$ and the corresponding actual position $(x_a, y_a)$ in terms of a "grid." Such a grid may be modeled as a combination of translation maps Dx(y) (error in x as a function of position in y) and Dy(x) (error in y as a function of position in x), a rotation map Rz(x,y) (rotation about the Z axis as a function of (x,y) position), a non-orthogonality factor (e.g. based on an angle between mirrors Mx and My), and a scaling factor (relating the measurement scales in x and y). These contributions may also be represented as a trio of maps Dx(x,y), Dy(x,y) and Rz(x,y) (respectively, error in x, error in y, and rotation about Z, each as a function of (x,y) position).

A positioning system may be characterized by more than one such grid. In a lithographic apparatus, for example, the system used to measure the table position at an alignment station may differ from the system used to measure the table position at an exposure station. In such a case, an "exposure grid" may be used to represent a position error map of a wafer chuck at an exposure station and a "measurement grid" may be used to represent a position error map of the wafer chuck at a measurement station.

Figure 5:
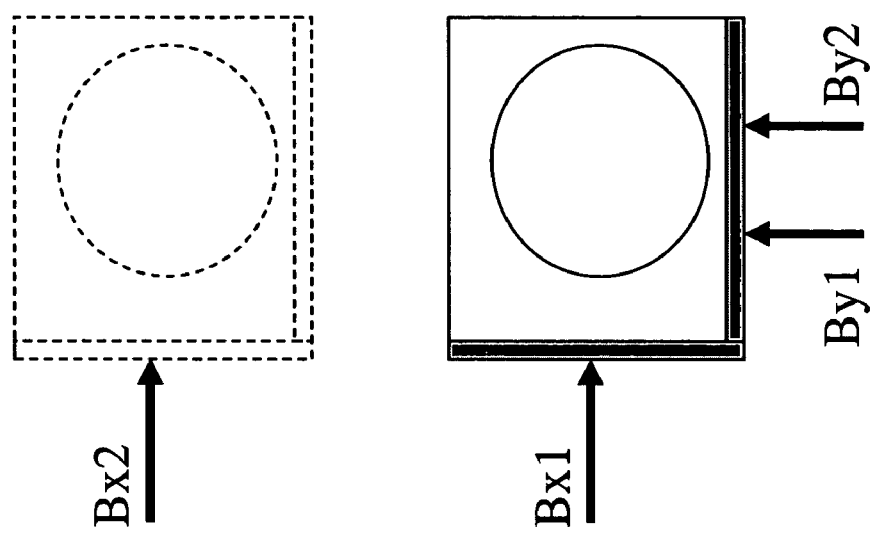
FIG. 5 shows two stations in a single-stage arrangement.

FIG. 5 shows an example in which a single table moves between two such stations. At one station (e.g. a "measure" station, at which the table may be moved to various positions in the X-Y plane during operations to align the wafer to the table and/or to measure a map of the wafer surface in Z), the X position is measured using beam Bx1. At the other station (e.g. an "expose" station, at which the table may be moved to various positions in the X-Y plane to successively position one or more areas of the wafer with respect to a projection lens for exposure, according to the information measured at the "measure station"), the X position is measured using beam Bx2. Thus, the system used to measure the table position at one station differs from the system used to measure the table position at the other station.

Figure 6:
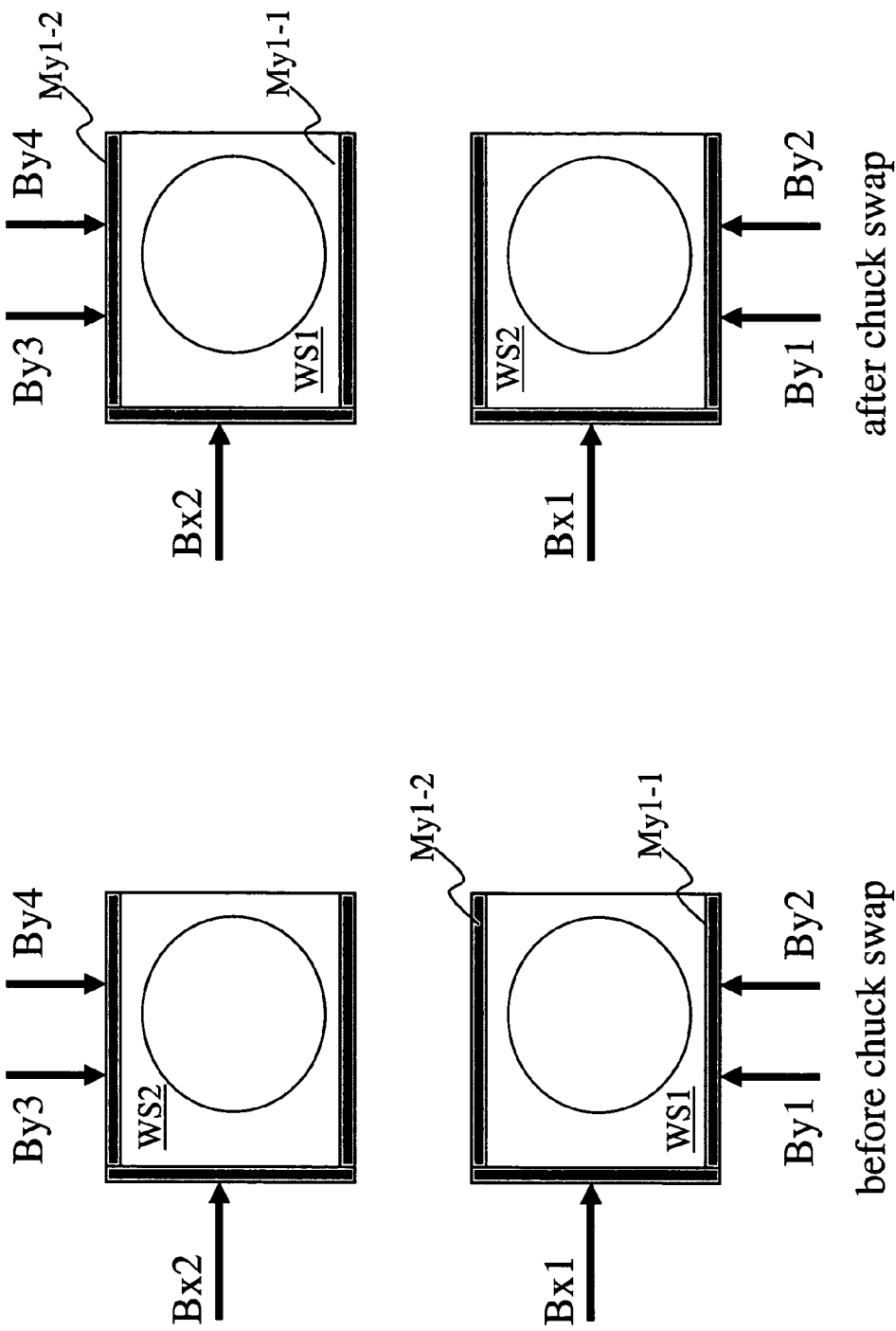
FIG. 6 shows two stations in a dual-stage arrangement.

FIG. 6 shows an example in which two tables are moved between two such stations (e.g. via an operation commonly referred to as a "chuck swap"). A potential advantage of including such an arrangement in one machine is an increase in throughput, in that one article may be exposed while the next article to be exposed is being measured. In this example, different beams as well as different mirrors are used to measure the Y position of a chuck at each station. One of ordinary skill will appreciate that in such case, measurements of one of the tables taken along the Y axis at the two stations may be subject, for example, to different unflatness errors.

In order to obtain a representation of position measurement errors in a precision positioning system (e.g. in the form of a grid), a calibration operation may be performed. To support such an operation, the table may be provided with a set of alignment marks. Alternatively, an object carried by the table (e.g. a substrate or wafer) may be provided with alignment marks. For example, the table may be moved to different X-Y positions at an exposure station while, at each of the table positions, one or more alignment marks is exposed onto a sensitive substrate carried by the table. Because of errors in positioning of the table, the relative positions of the alignment marks on the substrate may differ from what was intended.

After exposure of the alignment marks, the wafer may be removed from the table for post-exposure bake (PEB), development and hard bake, after which the wafer may be returned to the table for measurement of the positions of the marks at the measurement station. As a result of the removal and replacement of the wafer, the position of the wafer relative to the table at the exposure station may differ from the position of the wafer relative to the table at the measurement station. (In some applications of embodiments of the invention, removal of the wafer from the table is not required for measurement. For example, in some cases measurement may be performed upon latent mark images.)

Due to errors as discussed herein (which may vary from one station to the other), neither the actual position of the table when each of the marks were exposed, nor the position of the table when each of the marks is measured, may be perfectly known. Moreover, as noted above, it may be necessary to remove the wafer from the table between the exposure and the measurement (e.g. to develop the exposed marks before measurement), thus introducing additional positional uncertainty.

Figure 7:
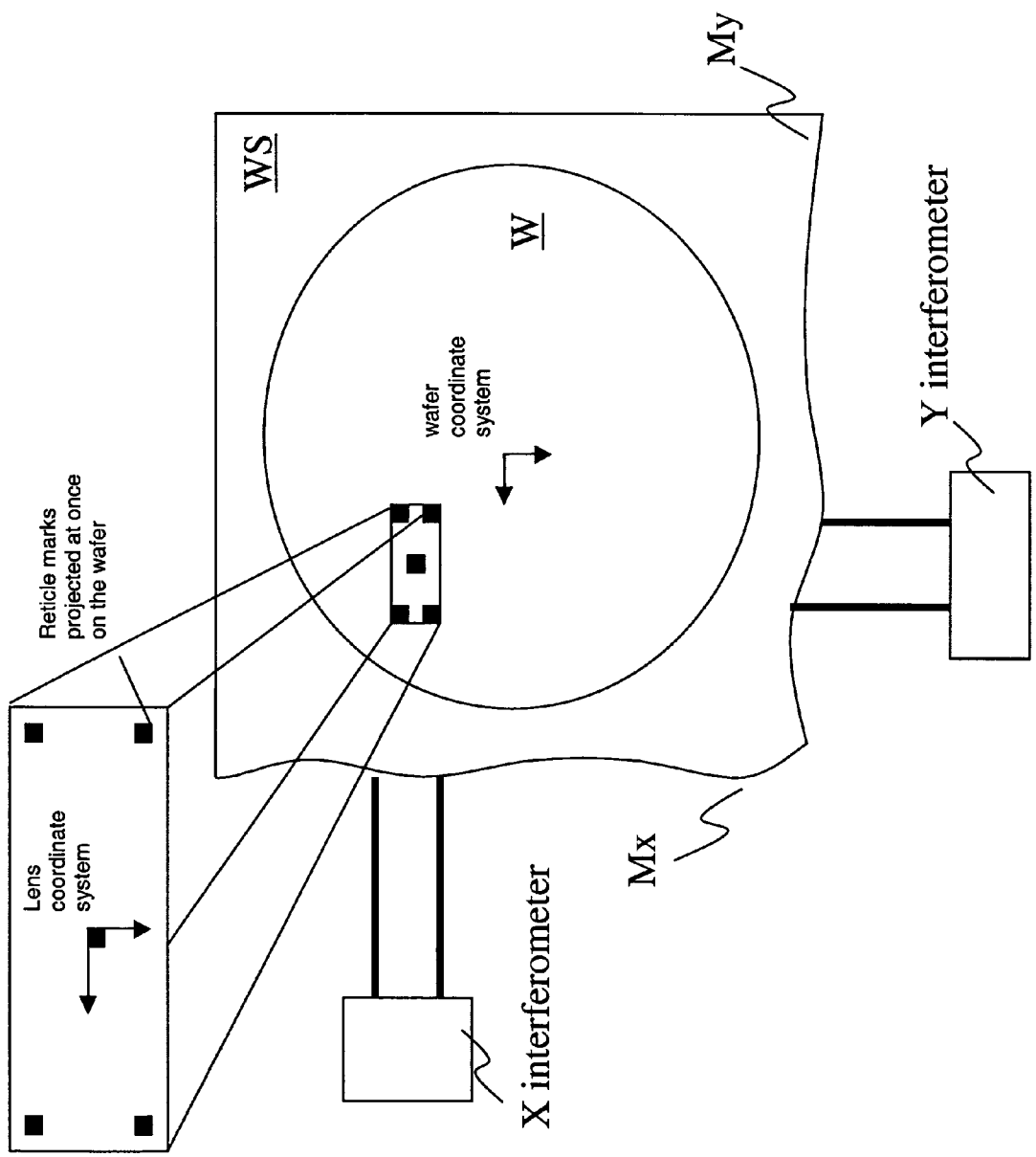
FIG. 7 shows an exposure of a pattern including a multi-mark reticle layout.

If a pattern of more than one alignment mark is exposed in a single exposure, relative positional errors among these marks as formed on the wafer may be greatly reduced or eliminated. FIG. 7 depicts an example in which a set of reticle marks (in this case, five marks) are exposed at once at an exposure station. Consequently, they correspond to one position of the wafer stage at the exposure station, i.e. to a single common position measurement error. At the measurement station, however, the marks may be used to obtain up to five different position measurements, each having a different measurement error. Because the relative measured positions are largely or entirely independent of errors in the position measurement system of the exposure station, they may be used to obtain information especially characteristic of nonidealities in the position measurement system of the measurement station. For example, the relative measured positions are independent of any unflatness, non-orthogonality, or scaling errors at the exposure station.

In the particular pattern layout as shown in FIG. 7, the set of marks may be used to support measurement at several different X and Y positions. Additionally, the distribution of the marks provides a pattern covering several coordinate locations of the wafer that corresponds to a single exposure station position.

A system of equations (1)–(2) relating x and y mark position errors to different error sources are given below. This system provides for exposure of more than one mark at a single exposure station position (e.g. as shown in FIG. 7). These equations relate to the use of marks that indicate a position along one of the X and Y axes:

$$x_{i,waf,em,meas} - x_{i,waf,em,int} = \Delta YTX^{Ee} - \Delta YTX_i^{Mm} + y_{i,lens}\Delta XRZ^{Ee} + \Delta sfx^{Ee}X^{Ee} - \Delta sfx^{Mm}X_i^{Mm} - \Delta Rzmx^{Ee}Y^{Ee} + \Delta Rzmx^{Mm}Y_i^{Mm} + \Delta wm_{em}x_{i,waf,em,int} - \Delta wr_{em}y_{i,waf,em,int} + \Delta wx_{em} + \Delta rx_i; \quad (1)$$

$$y_{i,waf,em,meas} - y_{i,waf,em,int} = \Delta XTY^{Ee} - \Delta XTY_i^{Mm} - x_{i,lens}\Delta XRZ^{Ee} + \Delta sfy^{Ee}Y^{Ee} - \Delta sfy^{Mm}Y_i^{Mm} + \Delta Rzmy^{Ee}X^{Ee} - \Delta Rzmy^{Mm}X_i^{Mm} + \Delta wm_{em}y_{i,waf,em,int} + \Delta wr_{em}x_{i,waf,em,int} + \Delta wy_{em} + \Delta ry_i. \quad (2)$$

In these equations, the following notation is used:
i indicates the mark index (within the multi-mark reticle layout);
"waf" denotes a coordinate in the wafer coordinate system, and "lens" denotes a coordinate in the lens coordinate system;
"e" and "m" denote the expose chuck and the measure chuck, respectively;
terms "meas" and "int" denote the measured position and the intended position, respectively;
"E" and "M" denote, respectively, the exposure station and the measurement station;
X and Y indicate wafer stage X and Y position, respectively;

YTX indicates the translation map X as function of Y, XTY indicates the translation map Y as function of X, and XRZ indicates the rotation map Rz as function of X;
sfx denotes the interferometer X scaling, and sfy denotes the interferometer Y scaling;
Rzmx and Rzmy denote the Rz error of the x and y mirrors, respectively;
wm denotes wafer magnification, wr denotes wafer rotation, wx denotes wafer translation in x, and wy denotes wafer translation in y; and
rx and ry denote, respectively, the reticle mark errors in x and y.

These notations may vary in practice. For example, the ratio of sfx to sfy (or vice versa) may be used rather than two separate parameters. In another example, one of the Rz mirror errors (e.g. Rzmx) may be defined as zero, and a parameter sxy=Rzmx−Rzmy (in this case, −Rzmy) may be used to denote non-orthogonality between the mirrors. Equations (1) and (2) also provide for different combinations of station and chuck in a machine having more than one chuck (e.g. four combinations (E1M1, E1M2, E2M1, and E2M2) for a dual-chuck machine), which may provide more information and allow a more accurate calibration.

Figure 8:
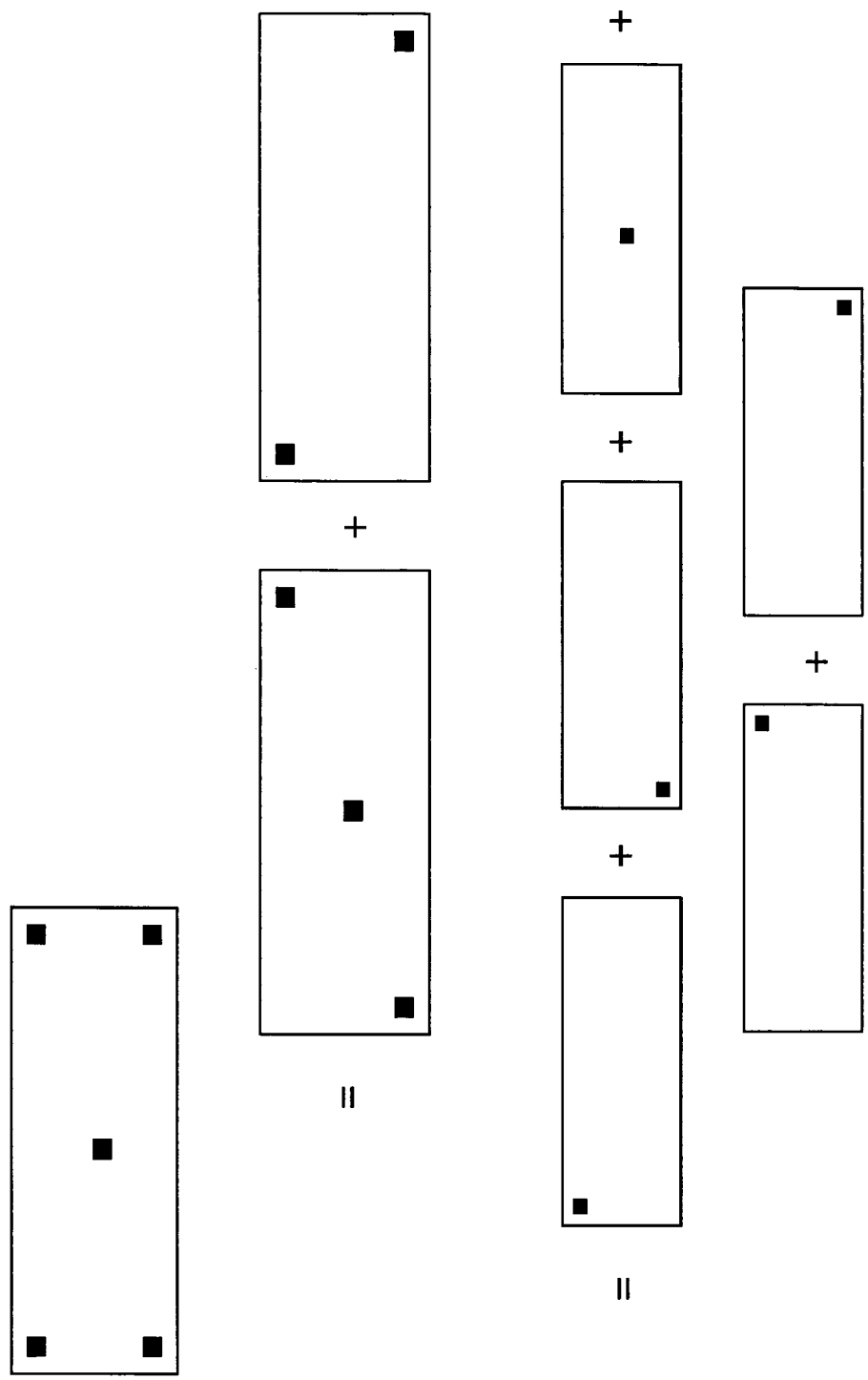
FIG. 8 shows two examples of sets of reticles that may be used to form the pattern of FIG. 7.

Note that it is also possible to expose a multi-mark layout at a single exposure station position using more than one reticle, each having one or more marks. FIG. 8 shows two such examples based on the example layout of FIG. 7. In such a case, it may be necessary to account (e.g. in system (1)–(2)) for errors of each reticle.

Figure 9:
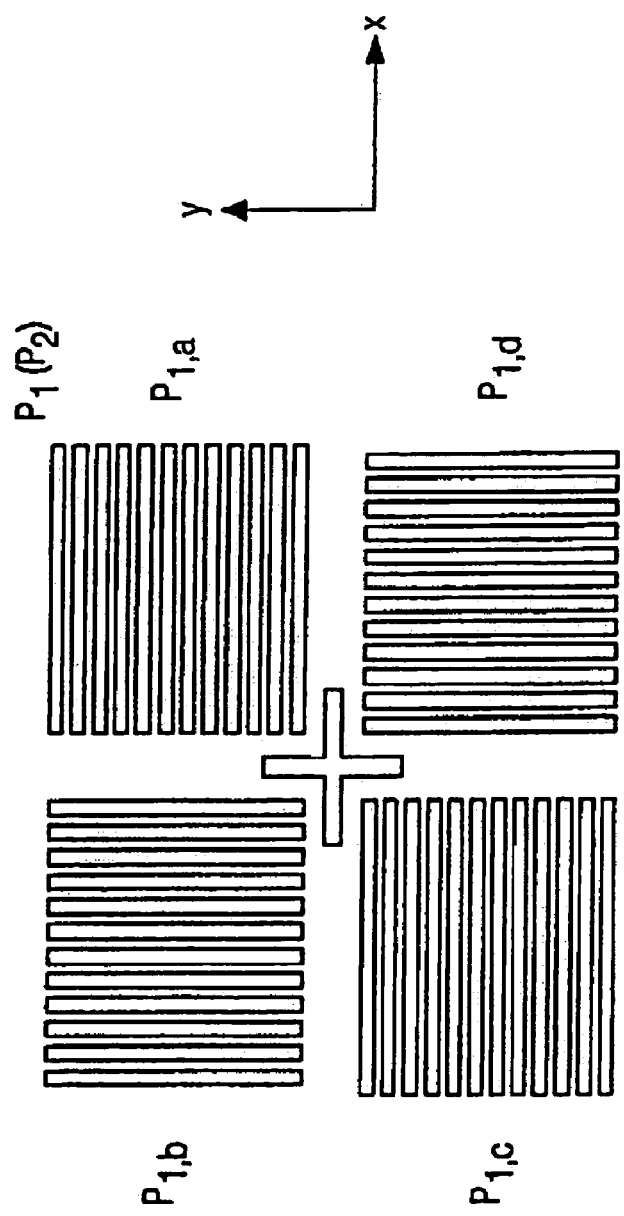
FIG. 9 shows one example of an ortho-box.

The term "ortho-box" is used herein to indicate a mark that provides a position in more than one orthogonal direction. An ortho-box can be of any suitable size, and although the word "box" is used, it should be understood that the ortho-box can be a triangle, a circle, or any other suitable shape. FIG. 9 shows one example of an ortho-box in the form of a phase gratings. This example includes four sub-gratings $P_{1,a}$, $P_{1,b}$, $P_{1,c}$ and $P_{1,d}$, two of which ($P_{1,b}$ and $P_{1,d}$) serve for alignment in the X direction and the two other (($P_{1,a}$ and $P_{1,c}$) serve for alignment in the Y direction. The two sub-gratings $P_{1,b}$ and $P_{1,c}$ have a grating period of, for example 16 microns and the sub-gratings $P_{1,a}$ and $P_{1,d}$ have a grating period of, for example 17.6 microns. Each sub-grating may have a dimension of, for example 200×200 microns. An alignment accuracy which, in principle, is smaller than 0.1 microns can be achieved with this grating mark and a suitable optical system. By choosing different grating periods, the capture range of the alignment unit can be enlarged. This range is, for example, 40 microns.

In some applications of embodiments of the invention, the wafer may be rotated by an angle (called a "wafer load angle") between its position on the table at the measure station and its position on the table (e.g. after development) at the measurement station. In such a case, it may be desirable for the ortho-box marks to be configured for alignment at two or more of the wafer load angles. These load angles are usually 0, 90, 180, and 270 degrees but can be any other chosen load angles. As discussed above in relation to the use of a multi-mark layout, differences between relative measured positions of the marks at one load angle and the same relative measured positions of the marks at another load angle are independent of any unflatness, non-orthogonality, or scaling errors at the exposure station. Thus such measurements may be used to obtain information especially characteristic of nonidealities in the position measurement system of the measurement station.

Two examples of equations are given below that relate the x and y mark position discrepancies (distance between measured and intended position in the X-Y plane) to various error sources (including translation maps, rotation maps, non-orthogonality, scaling, wafer-load parameters, reticle errors) for a multi ortho-box reticle layout. These equations are for the case of exposure at 0 degrees and measurement at 0 degrees (Eq. (3)) and 90 degrees (Eq. (4)). However, it should be appreciated that it is also possible to expose at a different wafer load angle and/or to measure at a different wafer load angle (e.g. one of 0, 90, 180, and 270 degrees) than in the particular combinations presented in Equations (3) and (4):

$$\begin{pmatrix} x_{meas} - x_{int} \\ y_{meas} - y_{int} \end{pmatrix}_0 = \begin{pmatrix} X^E \\ 0 \end{pmatrix} \Delta sfx^{Ee} - \begin{pmatrix} X^M_{i,0} \\ 0 \end{pmatrix} \Delta sfx^{Mm} + \quad (3)$$

$$\begin{pmatrix} 0 \\ Y^E \end{pmatrix} \Delta sfy^{Ee} - \begin{pmatrix} 0 \\ Y^M_{i,0} \end{pmatrix} \Delta sfy^{Mm} - \begin{pmatrix} Y^E \\ 0 \end{pmatrix} \Delta Rzmx^{Ee} +$$

$$\begin{pmatrix} Y^M_{i,0} \\ 0 \end{pmatrix} \Delta Rzmx^{Mm} + \begin{pmatrix} 0 \\ X^E \end{pmatrix} \Delta Rzmy^{Ee} - \begin{pmatrix} 0 \\ X^M_{i,0} \end{pmatrix} \Delta Rzmy^{Mm} +$$

$$\begin{pmatrix} \Delta YTX^{Ee} \\ \Delta XTY^{Ee} \end{pmatrix} - \begin{pmatrix} \Delta YTX^{Mm} \\ \Delta XTY^{Mm} \end{pmatrix} + \begin{pmatrix} y_{i,lens} \\ -x_{i,lens} \end{pmatrix} \Delta XRZ^{Ee} +$$

$$\begin{pmatrix} X^E \\ Y^E \end{pmatrix} \Delta wm_0 + \begin{pmatrix} -Y^E \\ X^E \end{pmatrix} \Delta wr_0 + \begin{pmatrix} \Delta wx_0 \\ \Delta wy_0 \end{pmatrix} + \begin{pmatrix} \Delta rx_i \\ \Delta ry_i \end{pmatrix};$$

It should be noted that Equation (3) (for zero-degree wafer load angle) is in fact the same as the system (1)–(2) for multi-mark reticle layout. Also note that the contributions of errors from the exposure station are "flipped" in Equation (4) (for 90-degree wafer load angle) such that the errors in X contribute to discrepancy in Y and vice versa. These equations are modified in a similar manner for the cases of 180- and 270-degree wafer load angle.

Figure 10:
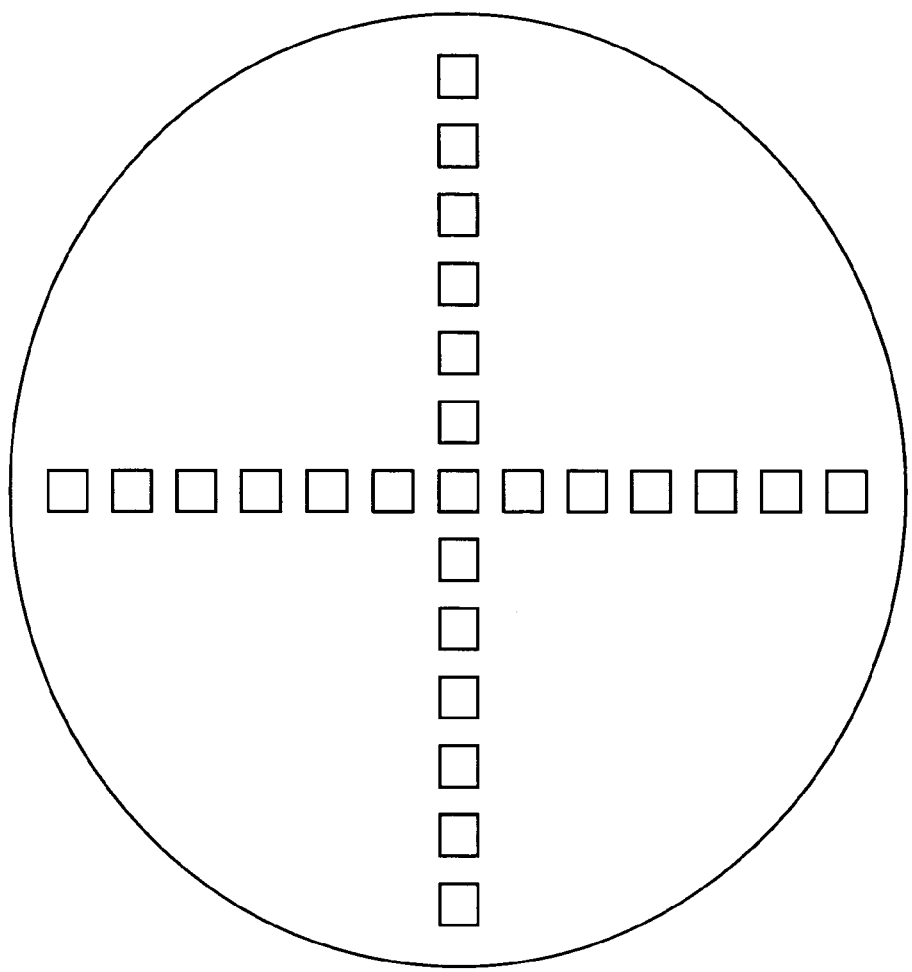
FIG. 10 shows a cruciform arrangement of alignment marks.
Figure 11:
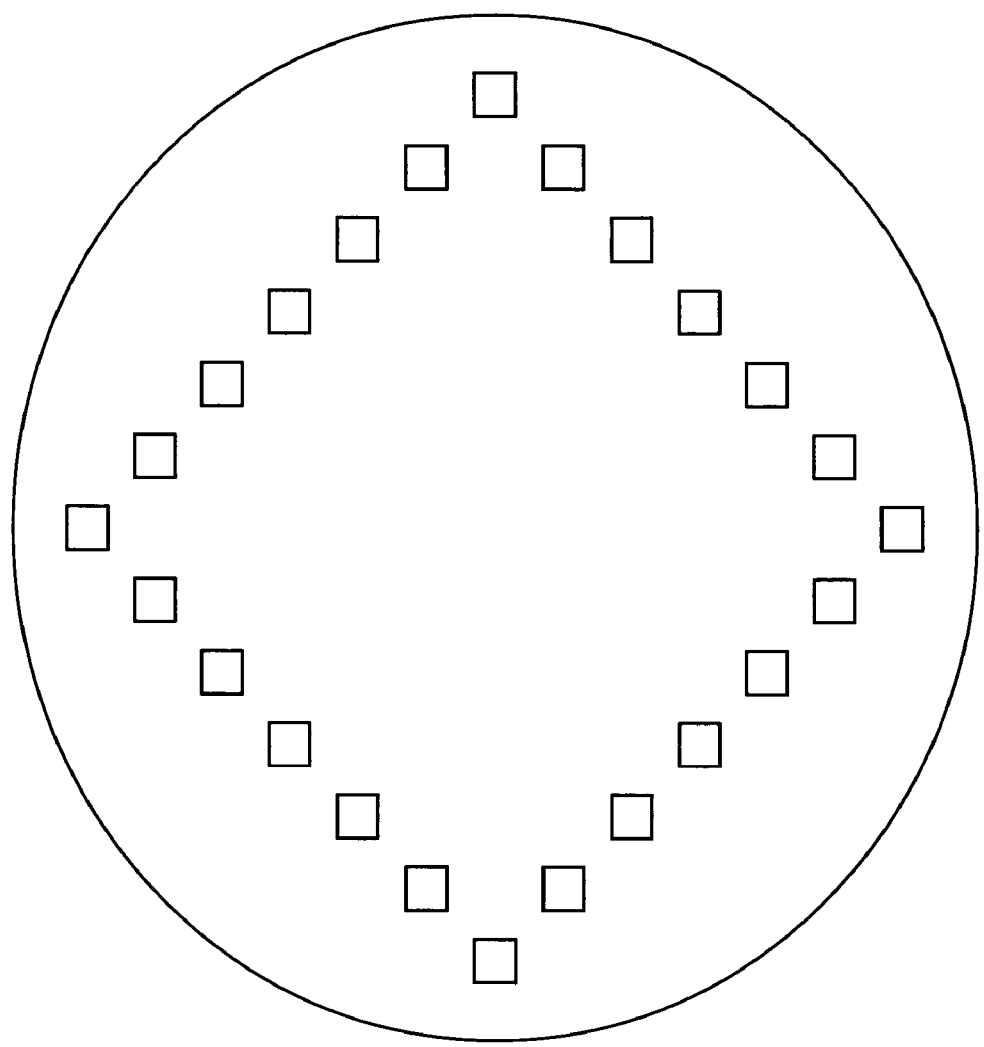
FIG. 11 shows a quadrilateral arrangement of alignment marks.

The ortho-boxes may be distributed across the wafer in any desired configuration. In FIG. 10 shows one example of a cruciform configuration in which ortho-boxes are aligned in a row along the x axis and in a column along the y axis. In other embodiments, the ortho-boxes may be arranged in polygonal configurations (e.g. the diamond quadrilateral as shown in FIG. 11). Such configurations may be used to obtain translation maps and to characterize nonorthogonality and scaling errors.

Unlike the example shown in FIG. 10, in the configuration of FIG. 11 no more than two ortho-boxes have the same position along either of the X and Y axes. Hence, the ortho-box marks in such a diamond configuration provide relative information in both X and Y. In the diamond configuration of FIG. 11, a higher degree of accuracy may be obtained with fewer ortho-box marks as compared to, for example, the cruciform configuration of FIG. 10. As a result, the same degree of accuracy may be obtained more quickly and efficiently by exposing fewer ortho-box marks at the exposure station and measuring fewer ortho-box marks at the measurement station.

Figure 12:
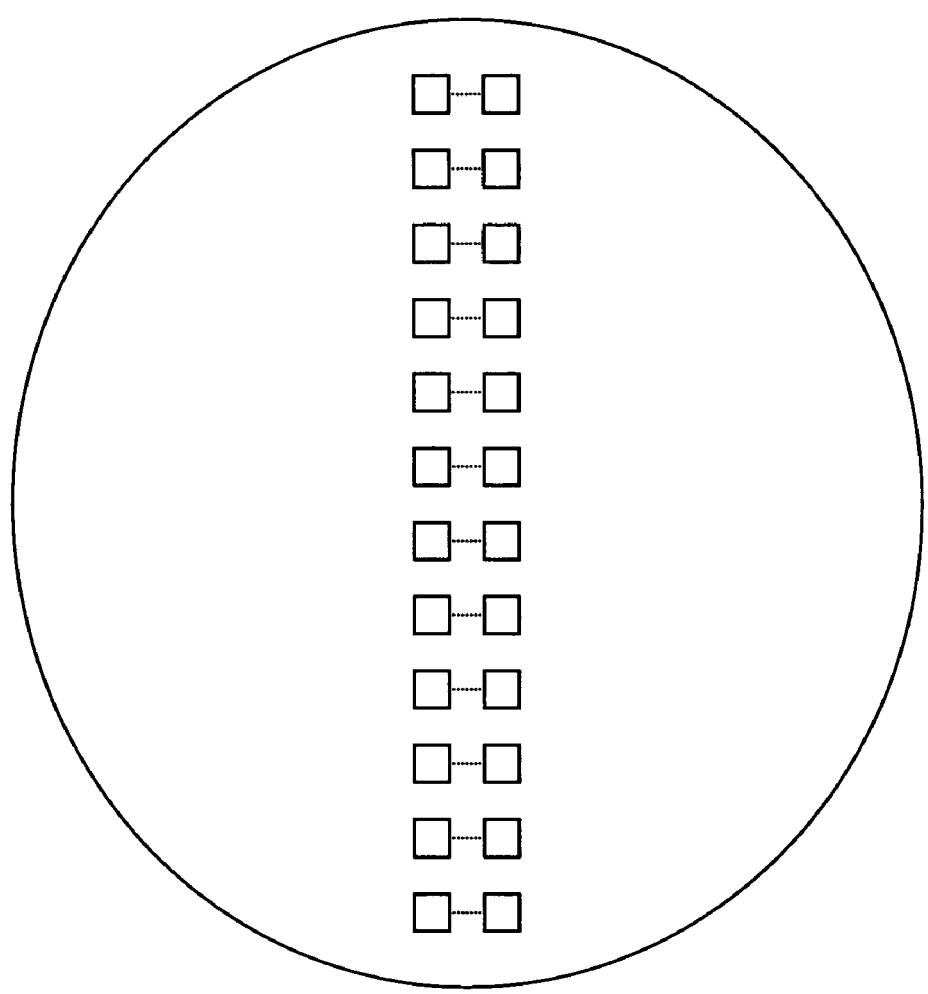
FIG. 12 shows a linear arrangement of multi-ortho-box layouts.

In the example of FIG. 10 and the embodiment of FIG. 11, each of the ortho-boxes is exposed onto the wafer at a different position of the table at the exposure station. FIG. 12 shows an example of a configuration according to another embodiment of the invention in which more than one ortho-box is exposed at the same position of the table at the exposure station (e.g. using a multi-ortho-box layout similar to the multi-mark layout shown in FIG. 7). The dashed lines in FIG. 12 serve only to indicate ortho-boxes that have been exposed at the same table position, and they need not be present on the wafer.

Figure 13:
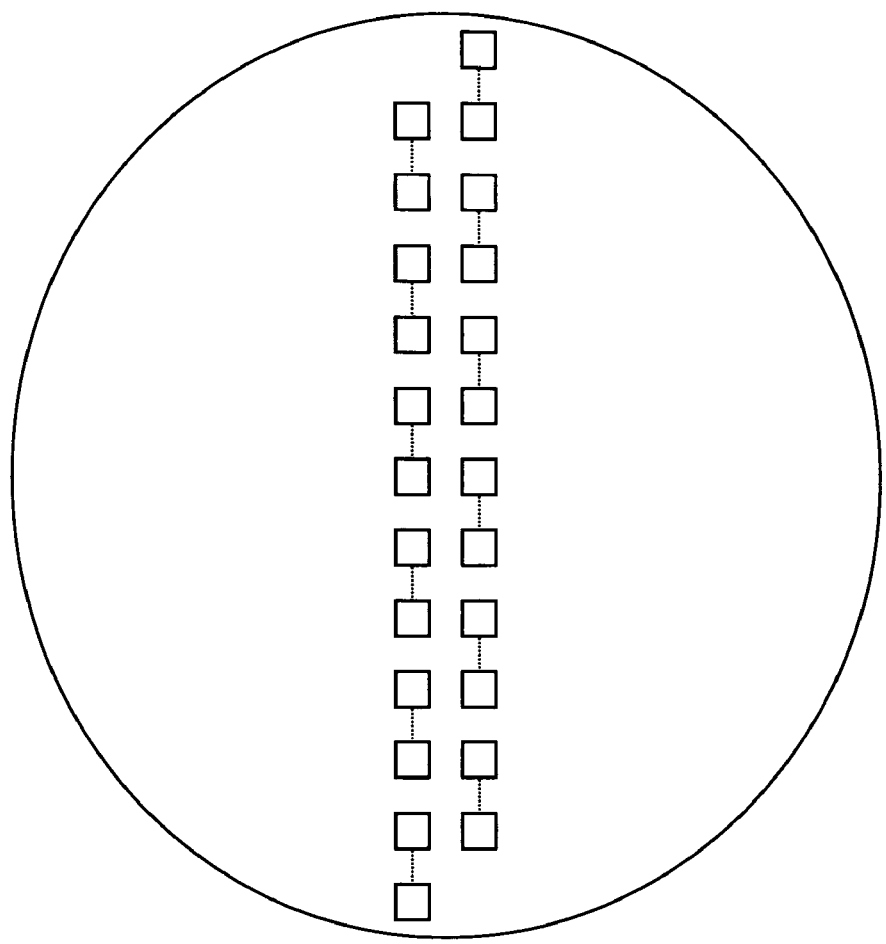
FIG. 13 shows an overlapping arrangement of multi-ortho-box layouts.

FIG. 13 shows another embodiment according to the present invention in which two rows of a multi-ortho-box pattern are printed on the wafer W. The overlapping (in the vertical direction of this figure) of ortho-boxes from different exposures allows more than one ortho-box to be read at a single measurement position, thus providing information about exposure station positioning error between such ortho-boxes that is largely or entirely free of measurement station positioning error.

Configurations as shown in FIGS. 12 and 13 may be used to obtain maps of error in rotation about Z as a function of position in X. Similar configurations may be used to obtain maps of error in rotation about Z as a function of position in Y. In fact, such configurations may also be used with normal marks (marks, such as diffraction or phase gratings, that indicate a position along only one axis) rather than ortho boxes. Although each such configuration may only provide rotation error information for one wafer load angle, another configuration of normal marks oriented in an orthogonal direction may be exposed onto the wafer (e.g. forming a cruciform arrangement overall) to enable characterization of both Rz(x) and Rz(y) with one wafer. (Orthogonal configurations of multi-ortho-box layouts may also be used to support measurement of both such rotation error maps.)

Figure 14:
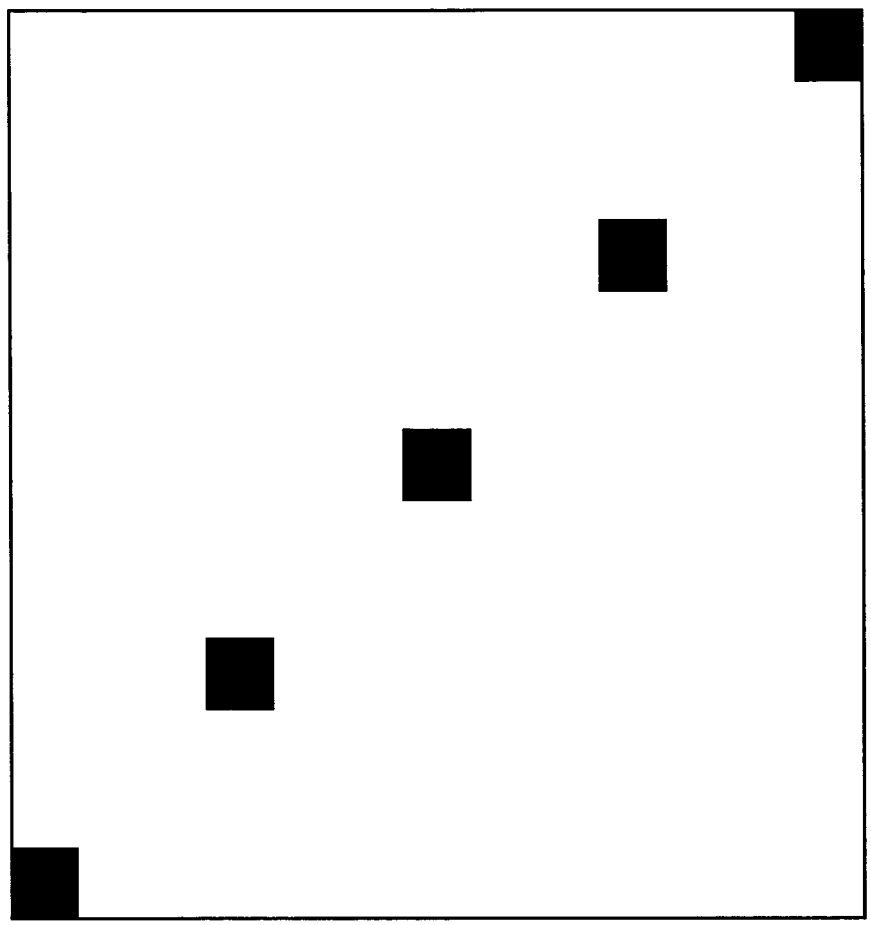
FIG. 14 shows a multi-mark reticle layout.
Figure 14:
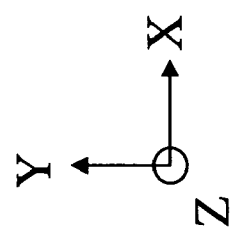

FIG. 14 shows a multi-mark reticle layout that includes a set of normal marks (in this example, five) arranged diagonally. In a particular but non-limiting implementation, each mark has a dimension of 0.512 mm along the X axis (possibly along the Y axis as well) and indicates a position in the X axis, and the spacing between the centers of the marks is 2 mm in both the X and Y directions. (These dimensions refer to the marks as exposed on the wafer, which may differ from the corresponding dimensions of the marks on the reticle layout e.g. by a magnification factor of the projection system.)

Figure 15:
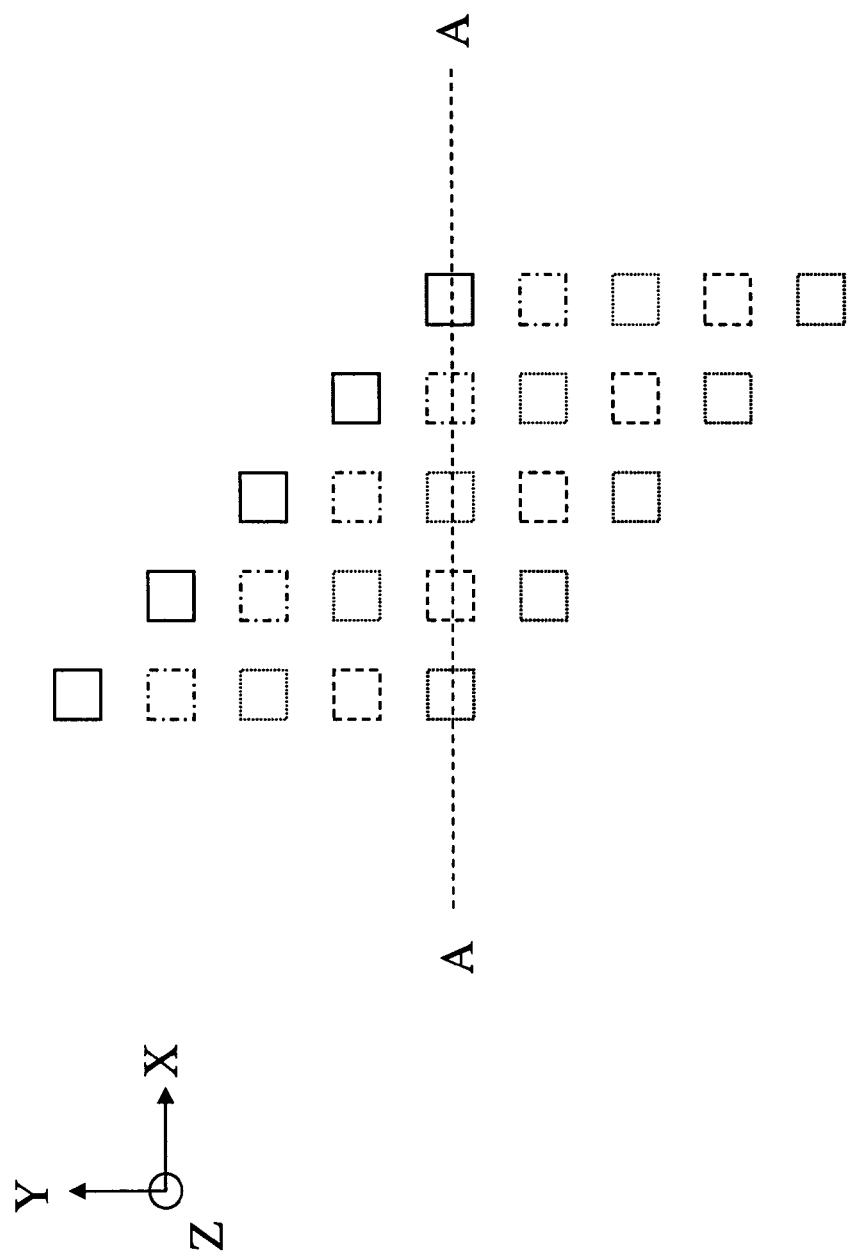
FIG. 15 shows a series of exposures of the layout of FIG. 14 at the same position in X and different positions in Y.

FIG. 15 shows how such a mark may be exposed several times on a wafer (with the different line qualities in the figure indicating the different exposures). In this example, each exposure is made at the same position along the X axis but at a corresponding different position along the Y axis (e.g. at an offset equal to the spacing between the marks). At the measurement station, positions of several marks along the X axis may be determined at a single position along the Y axis (e.g. up to five different positions in X along dotted line A—A). Because these marks are measured at substantially the same Y position, variations from their expected X positions may be attributed almost entirely to unflatness of the X mirror at the exposure station.

Figure 16:
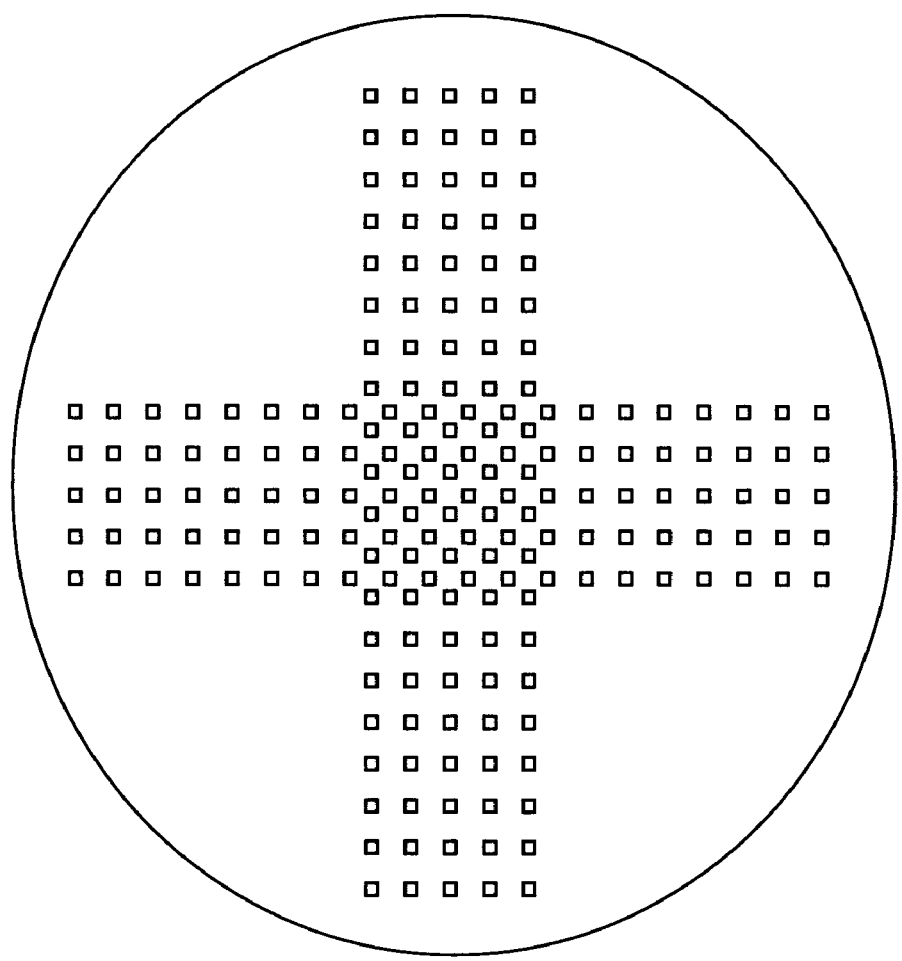
FIG. 16 shows an example of a wafer after a series of exposures of multi-mark layouts along different axes.

FIG. 16 shows an example of a wafer exposed as described with respect to FIGS. 14 and 15. As mentioned above, in this example the wafer is exposed with a similar series of the same layout at a different orientation (e.g. forming a cruciform configuration on the wafer) to support measurements along another axis (e.g. to support measurement of positions of several marks along the Y axis at a single position along the X axis). Other configurations are of course possible, and different layouts, offsets, etc. may be used for the exposures along the different axes.

In a further example, the multi-mark layout may be exposed onto the wafer at another stage of a multi-stage machine. In such case, the wafer at the second stage may be exposed at the same positions, varied by some predetermined offset, as at the first stage. In one example of 0.512-mm marks spaced at 2 mm in X and Y, with successive exposures offset by 2 mm along the Y axis, the exposures at the two stations may be offset by a distance of, e.g., 640 microns. Such an arrangement may allow even more information to be obtained at a single measurement position along one of the axes. Such an exposure of a multi-mark layout onto a wafer at two different stages may also be performed for more than one orientation of the wafer as discussed above.

Figure 17:
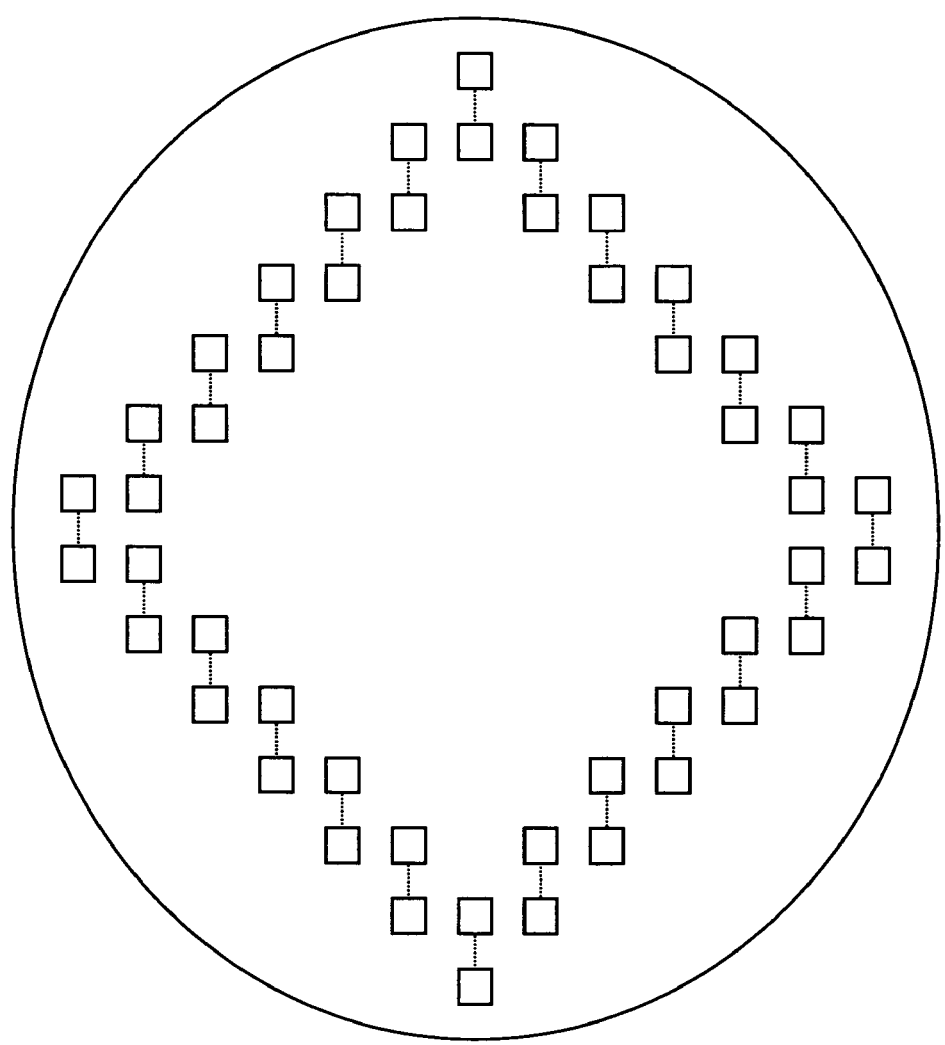
FIG. 17 shows a quadrilateral arrangement of multi-ortho-box layouts.

FIG. 17 shows a substrate according to another embodiment of the present invention. This embodiment is similar to the embodiment shown in FIG. 11 but instead of printing one ortho-box mark at each exposure, a multi-ortho-box layout pattern is printed at each exposure. The overlapping of the ortho-boxes from different exposures allows more than one ortho-box to be read at a single measurement position. The offset configuration of the multi-ortho-box layouts also provides additional information in the X and Y directions, as discussed above with regard to the embodiment of FIG. 11.

While specific embodiments of the invention have been described above, it will be appreciated that the invention may be practiced otherwise than as described. For example, such methods may include exposure of marks on a calibration wafer at more than one orientation of the wafer with respect to the table, and/or exposure of marks on a calibration wafer on different tables. Methods as described herein may also be implemented as software, firmware, hardware, or some combination of these (e.g. in the form of one or more sets of machine-executable instructions stored on a data storage medium such as a disk or computer memory). In an embodiment, there is provided a computer program comprising program code that, when executed on a computer system, instructs the computer system to perform any or all of the methods described herein. While lithographic applications have been discussed, it is expressly intended that embodiments of the invention include applications to precision positioning for other uses (e.g. nanofabrication, nanoassembly, nanoanalysis). The description is not intended to limit the invention.

We claim:

1. A method of calibrating a measurement system configured to measure a position of a table in a plane substantially parallel to a principal surface of a substrate carried by the table, said method comprising:
   measuring, with a first part of a measurement system, each of a plurality of exposure positions of a table along each of two orthogonal axes in the plane;
   exposing a mark onto the substrate at each of the plurality of exposure positions;
   for each of said marks, and for a first orientation of the substrate with respect to the table, using a second part of the measurement system different than the first part to measure along each of the two orthogonal axes a measurement position of the table corresponding to a location of the mark;
   for each of said marks, and for a second orientation of the substrate with respect to the table different than the first orientation, using the second part of the measurement system to measure along each of the two orthogonal axes a second measurement position of the table corresponding to a location of the mark;
   recording said measured exposure, measurement, and second measurement positions; and
   based on said recorded positions, obtaining a characterization of a position measurement error of the measurement system along one of the orthogonal axes as a function of position along both of the orthogonal axes.

2. The method of calibrating according to claim 1, wherein a relation between the first and second orientations is substantially equal to a nonzero integer multiple of ninety degrees.

3. The method of calibrating according to claim 1, wherein said exposing a mark onto the substrate comprises exposing onto the substrate, for at least one of the plurality of exposure positions, a pattern including a plurality of marks, each indicating a different position along at least one axis.

4. The method of calibrating according to claim 1, wherein the plurality of exposure positions includes three positions that are substantially different from each other along both of the orthogonal axes.

5. The method of calibrating according to claim 4, wherein the three positions are arranged substantially along a line that forms a substantial angle with both of the orthogonal axes.

6. The method of calibrating according to claim 4, wherein the plurality of exposure positions are substantially arranged on the principal surface along an outline of a polygon.

7. The method of calibrating according to claim 6, wherein said polygon is a quadrilateral whose axes form substantial angles with both of the orthogonal axes.

8. The method of calibrating according to claim 1, wherein said obtaining a characterization of a position measurement error includes obtaining a characterization of an unflatness of a surface of the table.

9. The method of calibrating according to claim 1, wherein said obtaining a characterization of a position measurement error includes obtaining a characterization of a nonorthogonality between two adjacent surfaces of the table.

10. The method of calibrating according to claim 1, wherein the first and second parts of the measurement system are configured to measure a position of the table along at least one of the orthogonal axes using the same position sensor.

11. The method of calibrating according to claim 1, wherein at least one of the first and second parts of the measurement system includes a laser interferometer.

12. The method of calibrating according to claim 1, wherein at least one of the first and second parts of the measurement system includes a reflective surface of the table.

13. The method of calibrating according to claim 1, wherein the first and second parts of the measurement system are configured to measure a position of the table along at least one of the orthogonal axes using the same surface of the table.

14. The method of calibrating according to claim 1, wherein all of the recorded positions upon which said obtaining a characterization of a position measurement error of the measurement system is based are measured using only a single substrate.

15. The method of calibrating according to claim 1, wherein at least one of the marks comprises at least one of the group consisting of a phase grating and a diffraction grating.

16. The method of calibrating according to claim 1, wherein said repeating said measuring and exposing is performed at a plurality of different orientations of the substrate with respect to the table.

17. The method of calibrating according to claim 1, said method comprising measuring, with the first part of the measurement system, a first position of a second table carrying the substrate along each of the two orthogonal axes and exposing a mark onto the substrate,
wherein said obtaining a characterization of a position measurement error of the measurement system is based on a recorded measured position of the second table corresponding to a mark exposed onto the substrate.

18. The method of calibrating according to claim 1, said method comprising:
patterning a beam of radiation with a pattern in its cross-section; and
exposing at least a portion of a radiation-sensitive layer on a second substrate carried by the table with the patterned beam,
wherein the pattern corresponds to a process layer of a device to be formed on the substrate, and
wherein said exposing is based on at least a portion of the characterization of the position measurement error of the measurement system.

19. A method of calibrating a measurement system configured to measure a position of a table in a plane substantially parallel to a principal surface of a substrate carried by the table, said method comprising:
measuring, with a first part of a measurement system, each of a plurality of exposure positions of a table along each of first and second orthogonal axes in the plane;
exposing a pattern onto the substrate at each of the plurality of exposure positions, said pattern comprising a plurality of marks;
at substantially the same measured position along the first axis, using a second part of the measurement system different than the first part to measure along the second axis a plurality of measurement positions of the table corresponding to locations of marks exposed at different exposure positions;
recording said measured exposure and measurement positions; and
based on said recorded positions, obtaining a characterization of a position measurement error of the measurement system about an axis orthogonal to the plane as a function of position along both of the orthogonal axes.

20. The method of calibrating according to claim 19, wherein at least one of the marks indicates a position along both orthogonal axes.

21. The method of calibrating according to claim 19, wherein said exposing a pattern includes exposing marks that indicate different positions along the first axis.

22. The method of calibrating according to claim 19, wherein said exposing a pattern includes exposing marks that indicate different positions along the second axis.

23. The method of calibrating according to claim 22, said method comprising repeating said measuring along the second axis for at least one other measured position along the first axis.

24. The method of calibrating according to claim 19, wherein said exposing a pattern onto the substrate at each of the plurality of exposure positions is performed for a first orientation of the substrate with respect to the table,
said method comprising, for a second orientation of the substrate with respect to the table different than the first orientation, measuring each of a plurality of second exposure positions of the table and exposing a pattern onto the substrate at each of the plurality of second exposure positions.

25. The method of calibrating according to claim 24, said method comprising, at substantially the same measured position along the second axis, using a second part of the measurement system different than the first part, measuring along the first axis a plurality of second measurement positions of the table corresponding to locations of marks exposed at different second exposure positions.

26. The method of calibrating according to claim 24, wherein a relation between the first and second orientations is substantially equal to a nonzero integer multiple of ninety degrees.

27. The method of calibrating according to claim 24, wherein the plurality of exposure positions includes positions that are substantially the same along the first axis and substantially different from each other along the second axis, and
wherein the plurality of second exposure positions includes positions that are substantially the same along the second axis and substantially different from each other along the first axis.

28. The method of calibrating according to claim 19, wherein the plurality of exposure positions includes positions that are substantially the same along the first axis and substantially different from each other along the second axis.

29. The method of calibrating according to claim 19, wherein said obtaining a characterization of a position measurement error includes obtaining a characterization of an unflatness of a surface of the table.

30. The method of calibrating according to claim 19, wherein said obtaining a characterization of a position measurement error includes obtaining a characterization of a nonorthogonality between two adjacent surfaces of the table.

31. The method of calibrating according to claim 19, wherein the first and second parts of the measurement system are configured to measure a position of the table along at least one of the orthogonal axes using the same position sensor.

32. The method of calibrating according to claim 19, wherein at least one of the first and second parts of the measurement system includes a laser interferometer.

33. The method of calibrating according to claim 19, wherein at least one of the first and second parts of the measurement system includes a reflective surface of the table.

34. The method of calibrating according to claim 19, wherein the first and second parts of the measurement system are configured to measure a position of the table along at least one of the orthogonal axes using the same surface of the table.

35. The method of calibrating according to claim 19, wherein all of the recorded positions upon which said obtaining a characterization of a position measurement error of the measurement system is based are measured using only a single substrate.

36. The method of calibrating according to claim 19, wherein at least one of the marks comprises at least one of the group consisting of a phase grating and a diffraction grating.

* * * * *